(12) United States Patent
Masui et al.

(10) Patent No.: US 8,278,128 B2
(45) Date of Patent: Oct. 2, 2012

(54) ENHANCEMENT OF OPTICAL POLARIZATION OF NITRIDE LIGHT-EMITTING DIODES BY WAFER OFF-AXIS CUT

(75) Inventors: Hisashi Masui, Santa Barbara, CA (US); Hisashi Yamada, Ibaraki (JP); Kenji Iso, Fujisawa (JP); Asako Hirai, Santa Barbara, CA (US); Makoto Saito, Santa Barbara, CA (US); James S. Speck, Goleta, CA (US); Shuji Nakamura, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 736 days.

(21) Appl. No.: 12/364,272

(22) Filed: Feb. 2, 2009

(65) Prior Publication Data
US 2010/0052008 A1    Mar. 4, 2010

Related U.S. Application Data

(60) Provisional application No. 61/025,600, filed on Feb. 1, 2008.

(51) Int. Cl.
*H01L 21/00* (2006.01)
(52) U.S. Cl. ............... 438/46; 438/29; 438/47; 438/93; 438/150; 438/285; 438/483; 438/503; 438/590; 438/604; 438/796
(58) Field of Classification Search .................. 438/29, 438/46, 47, 93, 150, 285, 483, 503, 590, 438/604, 796
See application file for complete search history.

(56) References Cited

U.S. PATENT DOCUMENTS

| 5,473,173 | A | 12/1995 | Takiguchi et al. |
|---|---|---|---|
| 6,316,785 | B1 | 11/2001 | Nunque et al. |
| 6,489,636 | B1 | 12/2002 | Goetz et al. |
| 6,515,313 | B1 | 2/2003 | Ibbetson et al. |
| 6,580,099 | B2 | 6/2003 | Nakamura et al. |
| 6,833,564 | B2 | 12/2004 | Shen et al. |
| 6,849,472 | B2 | 2/2005 | Kames et al. |
| 7,115,908 | B2 | 10/2006 | Watanabe et al. |
| 7,186,302 | B2 | 3/2007 | Chakraborty et al. |
| 7,208,393 | B2 | 4/2007 | Haskell et al. |
| 7,221,000 | B2 | 5/2007 | Shen et al. |
| 7,285,799 | B2 | 10/2007 | Kim et al. |

(Continued)

FOREIGN PATENT DOCUMENTS
WO    WO2007084782    7/2007

OTHER PUBLICATIONS

Yamada et al., "Impact of Substrate Miscut on the Characteristic of m-plane InGaN/GaN Light Emitting Diodes", Jpn. J. Appl. Phys. vol. 46, No. 46, p. L1117 (2007).
Okamoto et al., "Dislocation-free m-plane InGaN/GaN light-emitting diodes on m-plane GaN single crystals", Jpn. J. Appl. Phys. 45, L1197 (2006).
Tsujimura et al., "Characteristics of polarized electroluminescence from m-plane InGaN-based light emitting diodes", Jpn. J. Appl. Phys. 46, L1010 (2007).

(Continued)

*Primary Examiner* — Bac Au
(74) *Attorney, Agent, or Firm* — Gates & Cooper LLP

(57) ABSTRACT

An off-axis cut of a nonpolar III-nitride wafer towards a polar (−c) orientation results in higher polarization ratios for light emission than wafers without such off-axis cuts. A 5° angle for an off-axis cut has been confirmed to provide the highest polarization ratio (0.9) than any other examined angles for off-axis cuts between 0° and 27°.

26 Claims, 6 Drawing Sheets

U.S. PATENT DOCUMENTS

| | | | |
|---|---|---|---|
| 7,518,159 B2 | 4/2009 | Masui et al. | |
| 7,531,465 B2 | 5/2009 | Cho et al. | |
| 7,723,746 B2 | 5/2010 | Masui et al. | |
| 7,808,011 B2 | 10/2010 | Kim et al. | |
| 7,816,699 B2 | 10/2010 | Park et al. | |
| 8,044,417 B2 | 10/2011 | Masui et al. | |
| 8,158,497 B2 | 4/2012 | Hirai et al. | |
| 2002/0144645 A1 | 10/2002 | Kim et al. | |
| 2003/0024475 A1 | 2/2003 | Anderson | |
| 2003/0089917 A1* | 5/2003 | Krames et al. | 257/98 |
| 2003/0168653 A1 | 9/2003 | Tsujimura et al. | |
| 2003/0198837 A1 | 10/2003 | Craven et al. | |
| 2003/0205717 A1* | 11/2003 | Khare et al. | 257/103 |
| 2005/0142391 A1 | 6/2005 | Dmitriev et al. | |
| 2005/0161697 A1 | 7/2005 | Nakahata et al. | |
| 2005/0205884 A1 | 9/2005 | Kim et al. | |
| 2005/0208687 A1 | 9/2005 | Kasai et al. | |
| 2005/0214992 A1 | 9/2005 | Chakraborty et al. | |
| 2005/0224826 A1 | 10/2005 | Keuper et al. | |
| 2005/0236627 A1 | 10/2005 | Kim et al. | |
| 2005/0258451 A1 | 11/2005 | Saxler et al. | |
| 2006/0038191 A1 | 2/2006 | Onishi et al. | |
| 2006/0043400 A1 | 3/2006 | Erchak et al. | |
| 2006/0205199 A1 | 9/2006 | Baker et al. | |
| 2006/0215717 A1 | 9/2006 | Shigihara et al. | |
| 2006/0255341 A1* | 11/2006 | Pinnington et al. | 257/79 |
| 2006/0288928 A1 | 12/2006 | Eom et al. | |
| 2007/0029541 A1 | 2/2007 | Xin et al. | |
| 2007/0111488 A1 | 5/2007 | Chakraborty et al. | |
| 2007/0187700 A1 | 8/2007 | Kitaoka et al. | |
| 2007/0218703 A1* | 9/2007 | Kaeding et al. | 438/775 |
| 2007/0284567 A1 | 12/2007 | Pokrovskly et al. | |
| 2007/0285000 A1 | 12/2007 | Lim et al. | |
| 2008/0128727 A1 | 6/2008 | Erchak et al. | |
| 2008/0128728 A1 | 6/2008 | Nemchuk et al. | |
| 2008/0303039 A1 | 12/2008 | Craford et al. | |
| 2010/0090242 A1 | 4/2010 | Cho et al. | |
| 2010/0093123 A1 | 4/2010 | Cho et al. | |
| 2010/0226404 A1 | 9/2010 | Kim et al. | |
| 2010/0295090 A1 | 11/2010 | Craford et al. | |
| 2011/0027920 A1 | 2/2011 | Yamazaki et al. | |
| 2011/0037052 A1 | 2/2011 | Schmidt et al. | |
| 2011/0237054 A1 | 9/2011 | Iso | |
| 2012/0049158 A1 | 3/2012 | Masui | |

OTHER PUBLICATIONS

Nakagawa et al., "Temperature dependence of polarized electroluminescence from nonpolar m-plane InGaN-based light emitting diodes", Appl. Phys. Lett. 91, 171110 (2007).

Yamaguchi, "Anisotropic optical matrix elements in strained GaN quantum wells", Jpn. J. Appl. Phys. 46, L789 (2007).

Masui et al., "Optical polarization characteristics of m-oriented InGaN/GaN light-emitting diodes with various indium compositions in single-quantum-well structure", J. Phys. D: Appl. Phys. 41 (2008) 225104 (7pp).

International Search Report, International application No. PCT/US2009/032865, International filing date Feb. 2, 2009, date of mailing Mar. 12, 2009.

Chakraborty, A., et al., "Demonstration of nonpolar m-plane InGaN/GaN light-emitting diodes on free-standing m-plane GaN substrates", Japanese Journal of Applied Physics, Part 2 (Letters) Japan Soc. Appl. Phys Japan, vol. 44, No. 1-7, Jan. 14, 2005, pp. L173-L175, XP002602860.

Ni, X., et al., "Two-step epitaxial lateral overgrowth of a-plane GaN by MOCVD", Proceedings of the SPIE—The International Society for Optical Engineering SPIE—The International Society for Optical Engineering USA, vol. 6473, Jan. 22, 2007, pp. 647303-1, XP002602858.

Yamada, H., et al., "Impact of substrate miscut on the characteristic of m-plane InGaN/GaN light emitting diodes", Japanese Journal of Applied Physics, Part 2 (Letters) Japan Society of Applied Physics Through the Institute of Pure and Applied Physics Japan, vol. 46, No. 45-49, Nov. 22, 2007, pp. L1117-L1119, XP002602859.

Shao, Y-P. et al., "Electrical Characterization of Semipolar Gallium Nitride Thin Films", NNIN REU Research Accomplishments, Aug. 2005, pp. 132-133.

Kaeding et al., "Effect of Substrate Miscut on the Direct Growth of Semipolar (1011) GaN on (100) MgA12O4 by Metalorganic Chemical Vapor Deposition", Japanese Journal of Applied Physics, vol. 45, No. 21, 2006, pp. L536-L538.

John Francis Kaeding, "The Heteroepitaxial Growth of Semipolar GaN for light Emitting Diodes", Thesis, Mar. 2007.

Lai etal., "Effect of m-plane GaN substrate Miscut on InGaN/GaN quantum well growth", Journal of Crystal Growth, vol. 312, 2010, pp. 902-905.

\* cited by examiner

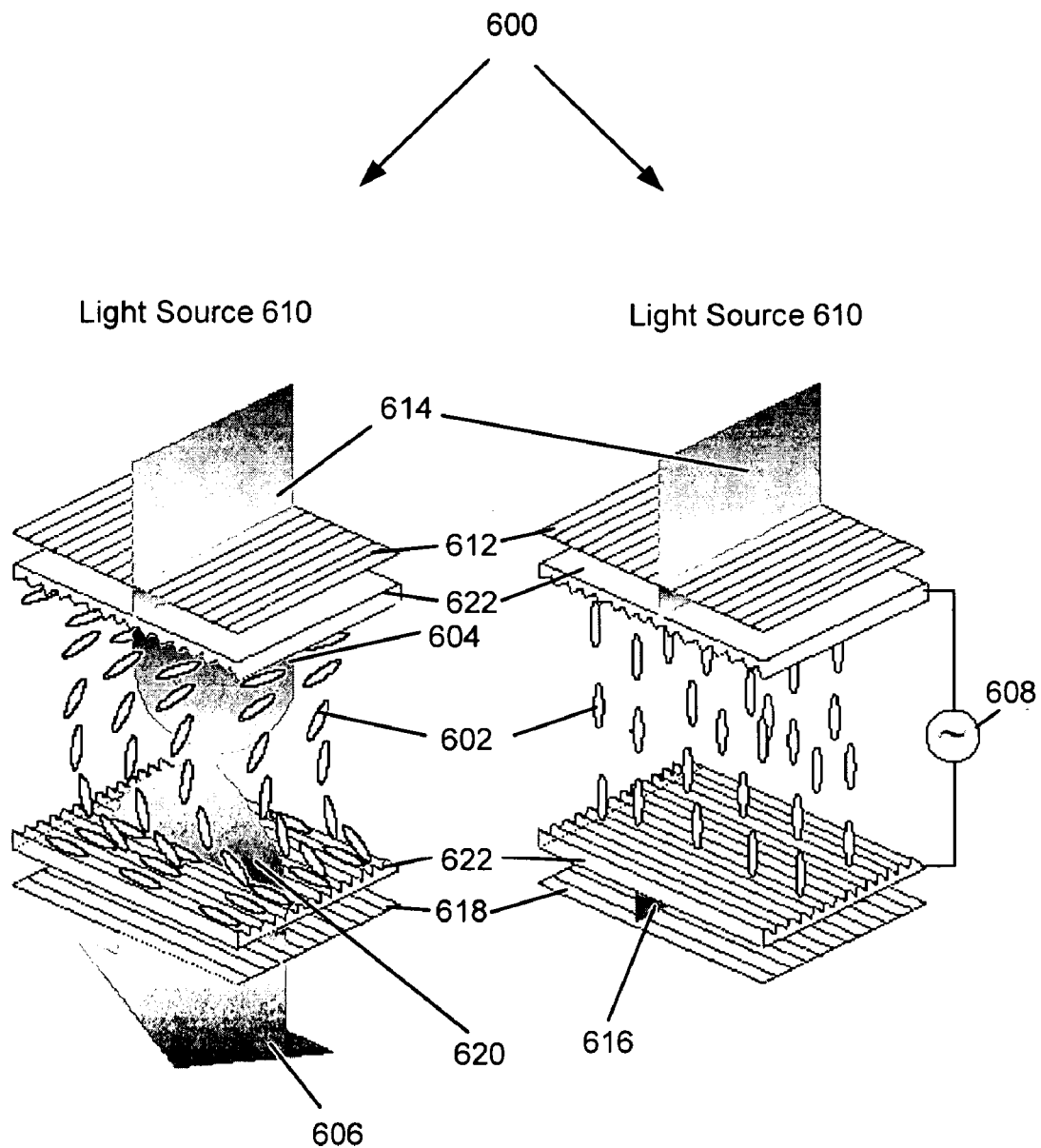
*FIG. 6(a)*   *FIG. 6(b)*

US 8,278,128 B2

ENHANCEMENT OF OPTICAL POLARIZATION OF NITRIDE LIGHT-EMITTING DIODES BY WAFER OFF-AXIS CUT

CROSS REFERENCE TO RELATED APPLICATIONS

This application claims the benefit under 35 U.S.C. Section 119(e) of commonly-assigned U.S. Provisional Patent Application Ser. No. 61/025,600, filed on Feb. 1, 2008, by Hisashi Masui, Hisashi Yamada, Kenji Iso, Asako Hirai, Makoto Saito, James S. Speck, Shuji Nakamura and Steven P. DenBaars, entitled "ENHANCEMENT OF OPTICAL POLARIZATION OF NITRIDE LIGHT-EMITTING DIODES BY WAFER OFF-AXIS CUT", which application is incorporated by reference herein.

This application is related to the following co-pending and commonly-assigned U.S. patent applications:

U.S. Utility application Ser. No. 12/140,096, filed on Jun. 16, 2008, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR M-PLANE GROUP III NITRIDE FILMS GROWN ON MISCUT SUBSTRATES", which application claims the benefit of U.S. Provisional Application Ser. No. 60/944,206, filed on Jun. 15, 2007, by Asako Hirai, Zhongyuan Jia, Makoto Saito, Hisashi Yamada, Kenji Iso, Steven P. DenBaars, Shuji Nakamura, and James S. Speck, entitled "PLANAR NONPOLAR M-PLANE GROUP III NITRIDE FILMS GROWN ON MISCUT SUBSTRATES";

U.S. Utility application Ser. No. 12/189,026, filed on Aug. 8, 2008, by Kenji Iso, Hisashi Yamada, Makoto Saito, Asako Hirai, Steven P. DenBaars, James S. Speck, and Shuji Nakamura, entitled "PLANAR NONPOLAR M-PLANE GROUP III-NITRIDE FILMS GROWN ON MISCUT SUBSTRATES", which application claims the benefit of U.S. Provisional Application Ser. No. 60/954,744 filed on Aug. 8, 2007 by Kenji Iso, Hisashi Yamada, Makoto Saito, Asako Hirai, Steven P. DenBaars, James S. Speck, and Shuji Nakamura, entitled "PLANAR NONPOLAR M-PLANE GROUP III-NITRIDE FILMS GROWN ON MISCUT SUBSTRATES," and U.S. Provisional Application Ser. No. 60/954,767 filed on Aug. 8, 2007, by Hisashi Yamada, Kenji Iso, Makoto Saito, Asako Hirai, Steven P. DenBaars, James S. Speck, and Shuji Nakamura, entitled "III-NITRIDE FILMS GROWN ON MISCUT SUBSTRATES"; and U.S. Utility application Ser. No. 12/364,258 filed on Feb. 2, 2009, by Hisashi Masui, Hisashi Yamada, Kenji Iso, James S. Speck, Shuji Nakamura and Steven P. DenBaars, entitled "ENHANCEMENT OF OPTICAL POLARIZATION OF NITRIDE LIGHT-EMITTING DIODES BY INCREASED INDIUM INCORPORATION," now U.S. Pat. No. 8,044,417, issued Oct. 25, 2011, which application claims the benefit under 35 U.S.C. Section 119(e) of co-pending and commonly-assigned U.S. Provisional Application Ser. No. 61/025,592, filed on Feb. 1, 2008, by Hisashi Masui, Hisashi Yamada, Kenji Iso, James S. Speck, Shuji Nakamura and Steven P. DenBaars, entitled "ENHANCEMENT OF OPTICAL POLARIZATION OF NITRIDE LIGHT-EMITTING DIODES BY INCREASED INDIUM INCORPORATION";

which applications are incorporated by reference herein.

BACKGROUND OF THE INVENTION

1. Field of the Invention

This invention relates to light-emitting diodes and more particularly to the enhancement of optical polarization of nitride light-emitting diodes by an off-axis cut of the wafer.

2. Description of the Related Art (Note: This application references a number of different publications as indicated throughout the specification by one or more reference numbers within brackets, e.g., Ref. [x]. A list of these different publications ordered according to these reference numbers can be found below in the section entitled "References." Each of these publications is incorporated by reference herein.)

Light-emitting diodes (LEDs) have been used in the last thirty years as indicator lamps, local illuminators, and optical transmitters, among their many applications. In the last ten years, high-brightness aluminum-indium-gallium nitride [(Al,In,Ga)N] based blue and green LEDs have been developed and have started to emerge in general lighting and full-color display applications.

In terms of LED fabrication, because of the incoherent and un-polarized light emission from conventional LEDs, it is not essential to define a particular die orientation of an LED package when the die is attached to the package. In common LED fabrication, die orientation is only significant when an LED wafer is diced, which is why LED photolithographic patterning onto a wafer is carried out by aligning the patterns along crystallographic directions. This alignment process makes die separation reliable and results in higher production yield.

In the case of AlInGaN LEDs prepared on an insulating substrate (for example, sapphire), where two electrical contacts are made on one side of an LED die, die orientation in relation to the package is significant in terms of position of the positive and negative metal contacts. These alignments for reliable die separation and electrical contacts are common practice for any semiconductor devices, not necessarily only in LED fabrication. However, LED die alignment has never been considered in fabrication in terms of emitted light properties.

Internal electrical polarization is a unique property of the AlInGaN system among the semiconductors used in opto-electronics, and this property originates in the hexagonal crystallographic structure of that material system. FIG. 1 schematically shows a generic hexagonal crystal structure 100 with principal crystallographic axes a1 102, a2 104, a3 106, c-axis 108 and typical crystallographic planes of interest (r-plane 110, a-plane 112, m-plane 114, and c-plane 116), with their labeling conventions.

Electrical polarization is created in the hexagonal structure due to its lack of inversion symmetry along the c-axis. For example, in the case of GaN, FIG. 2 illustrates the arrangement of atoms in the GaN crystal 200, wherein open circles 202 represent gallium (Ga) atoms and solid circles 204 represent nitrogen (N) atoms. Along the c-axis 206 of the GaN shown in FIG. 2, Ga atoms 202 (cation, positively charged) and N atoms 204 (anion, negatively charged) are positioned alternately and, as a whole, electric neutrality is maintained. Also shown in FIG. 2 is the a-axis 208.

However, because of the lack of inversion symmetry, there exists an internal electric field along the c-axis when the atoms are displaced from their ideal positions relative to each other along this c-axis. Since atoms in the AlInGaN system usually do not maintain their ideal positions, this polarization field almost always exists along the c-axis. For this reason, the c-plane is called a polar plane. Polarization fields do not exist along any of the a-axes or m-axes, due to the inversion symmetry along these particular axes. For this reason, a-planes and m-planes are called nonpolar planes. For these nonpolar planes, the polarization vector (which expresses direction and strength of the polarization field) is parallel to the planes, since the net polarization vector is parallel to the c-axis.

AlInGaN materials are conventionally grown in the c-direction (i.e., the direction along the c-axis), therefore on the c-plane. LEDs grown on the c-plane show negligible light polarization. On this c-plane, the polarization field has no in-plane component, and the isotropic mechanical stress within the c-plane in a quantum well (QW) structure of an LED does not change the nature of carrier recombination in the QW.

It has recently become possible to prepare AlInGaN LEDs on a- and m-planes. These LEDs exhibit linearly polarized light emission. The polarization field is in a particular direction (c-direction) in the plane, and the stress in the QW is anisotropic due to different degrees of lattice mismatch between the substrate and QW in the two perpendicular directions in the a- or m-plane. The inventors have confirmed that the emitted light from these nonpolar LEDs is linearly polarized in a direction perpendicular to the c-axis. Linearly polarized light is an electromagnetic wave that has its electric field only in one plane perpendicular to the wave's propagation. Non-polarized light has its electric field evenly distributed in directions in planes perpendicular to the wave's propagation. The principal application for polarized light is backlighting for liquid crystal displays (LCDs), for which LEDs are beneficial due to their compactness and energy efficiency as compared to conventional cold cathode fluorescent tubes.

AlInGaN LEDs prepared on a semipolar plane have also been confirmed to emit polarized light. The projection of the polarization vector, which is parallel to the c-axis, lies in the semipolar plane, similar to the nonpolar plane case.

Polarized light emission has been experimentally confirmed from LEDs prepared in nonpolar and semipolar orientations of (Al,In,Ga)N. While all conventional LEDs emit un-polarized light, polarized light emission is believed to be useful in certain applications such as backlighting for LCDs.

To take the advantage of polarized light emission, high polarization ratios are favorable. Thus, there is a need in the art for improved techniques for obtaining high polarization ratios in LEDs.

SUMMARY OF THE INVENTION

The present invention provides a technique to obtain high polarization ratios from nonpolar LEDs. LEDs grown on m-plane GaN wafers that have an off-axis cut tend to possess light-emitting characteristics with high polarization ratios. Off-axis cuts (known as "off-cuts") of the wafer are made towards a polar (−c) orientation. A 5° angle of off-cut has been confirmed to provide a higher polarization ratio (0.9) as compared to any other examined off-cut angles between 0° and 27°.

To overcome the limitations in the prior art described above, and to overcome other limitations that will become apparent upon reading and understanding the present specification, the present invention discloses a method for increasing a polarization ratio of light emission from an LED, comprising performing an off-axis cut of a nonpolar III-nitride towards a polar (−c or +c) orientation; and growing the LED on the off-axis cut nonpolar III-nitride.

The light emission has a higher polarization ratio than without the off-axis cut. For example, the off-axis cut may have an off-axis cut angle between 0° and 27° and the orientation may be [000-1]. The off-axis cut angle may be about 5° to provide a higher polarization ratio than other off-axis cut angles between 0° and 27°.

In some embodiments, the polarization ratio for an off-axis cut angle of 5° at the light emission's wavelength of 450 nm may be about 0.91, the polarization ratio for an off-axis cut angle of 10° at the light emission's wavelength of 430 nm may exceed 0.80, the polarization ratio for an off-axis cut angle of 0° at the light emission's wavelength of 470 nm may exceed 0.80, the polarization ratio for an off-axis cut angle of 27° at the light emission's wavelength of 450 nm may exceed about 0.55, and the polarization ratio for an off-axis cut angle of 0° at the light emission's wavelength of 390 nm may be about 0.55.

The present invention further discloses an LED, comprising one or more light-emitting layers on a surface of a nonpolar oriented III-nitride, wherein the surface is at an off-axis angle with respect to a nonpolar plane of the nonpolar oriented III-nitride, the angle is towards a [0001] or [000-1] direction or orientation, and the angle achieves a polarization ratio for light emitted by the light-emitting layers in excess of 0.8.

BRIEF DESCRIPTION OF THE DRAWINGS

Referring now to the drawings in which like reference numbers represent corresponding parts throughout:

FIG. 6(a) and FIG. 6(b) illustrate the principle of LCD operation, wherein, in a conventional technique, polarized light is obtained after passing the first polarizer.

DETAILED DESCRIPTION OF THE INVENTION

Figure 1:
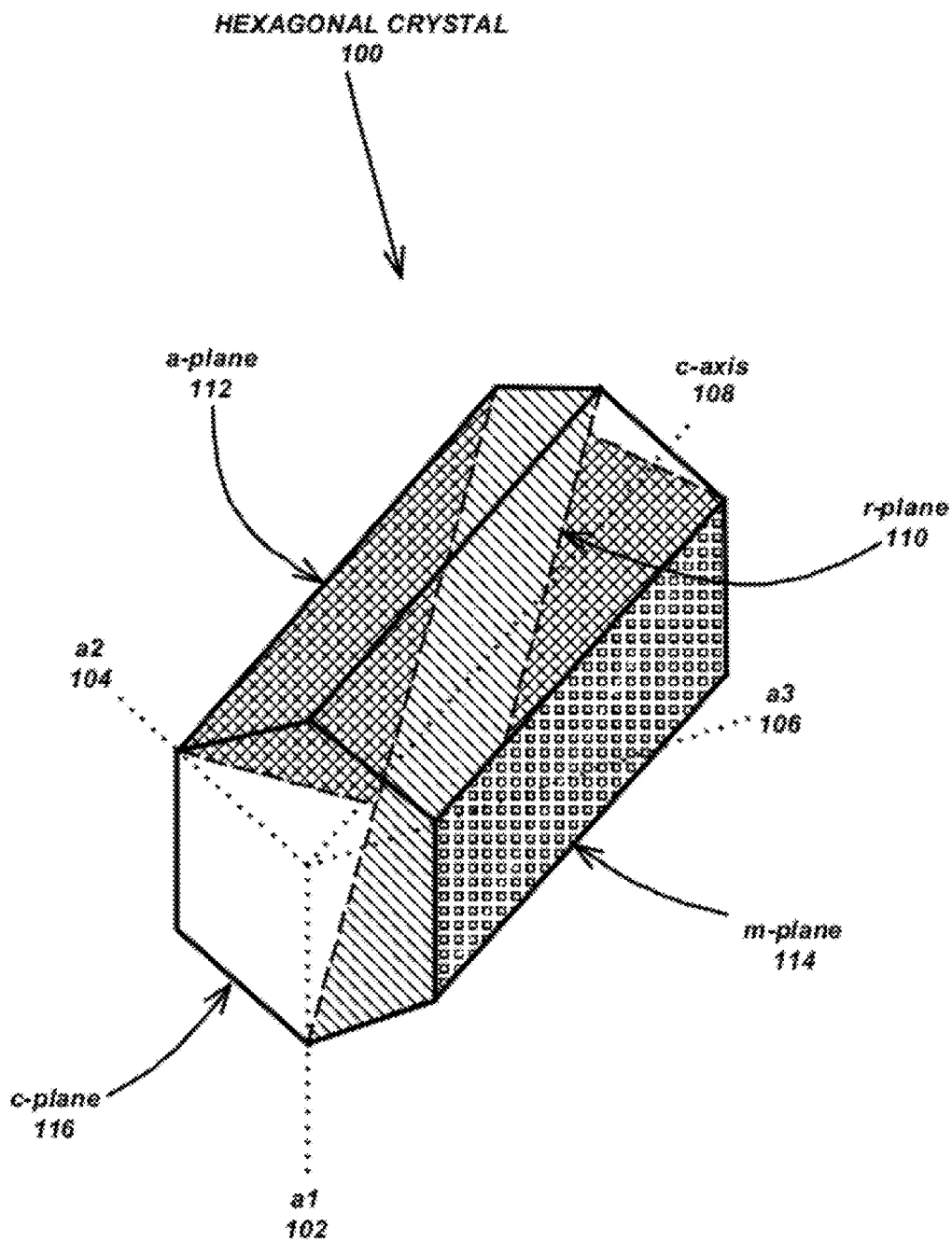
FIG. 1 is a schematic of a generic hexagonal crystal structure and crystal planes of interest.
Figure 2:
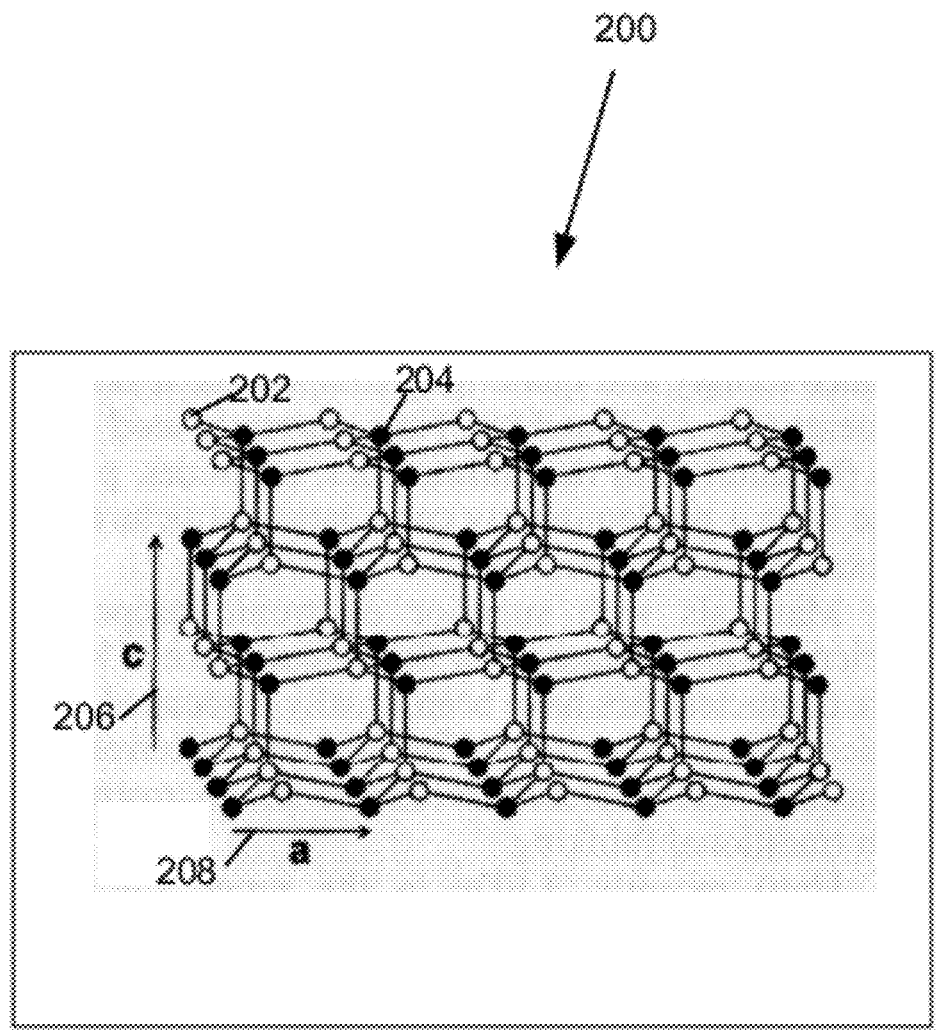
FIG. 2 illustrates the arrangement of atoms in a GaN crystal, wherein open circles represent Ga and solid circles represent N.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Terminology

It is worthwhile here to clarify the terminology used in this disclosure, which is based on the convention of this particular research field of gallium nitride (GaN) related materials.

Electrical polarization and light polarization are both important concepts in this invention, but are different physical phenomena, although they both have been referred to as "polarization".

Electrical polarization relates to polarization vectors and internal polarization electric fields, and is based on the crystallographic structure of a particular material system. In this case, the material is referred to as a "polar" material. If a material does not have internal electrical polarization, it is referred as a "nonpolar" material.

Light polarization relates to electromagnetic wave emission and the light is often referred to as "polarized" light. The concept of light polarization is based on how electromagnetic waves propagate in space.

Crystallographic planes of polar materials that have a polarization vector normal to the plane are referred to as "polar" planes. Those planes that have a polarization vector parallel to the plane are referred as "nonpolar" planes. Those planes that have a polarization vector at any other angle relative to the plane are referred to as "semipolar" planes. When this convention (polar, nonpolar, or semipolar) is applied to a device (for example, LEDs), it means the device is prepared on that (polar, nonpolar, or semipolar) crystal plane.

Overview

Nonpolar and semipolar AlInGaN-based LEDs have been shown to emit polarized light, while conventional LEDs only emit un-polarized light. The highest reported value of polarization ratio for a nonpolar LED is 0.8 (room temperature measurement). For practical applications, still higher polarization ratios are required. The present invention accomplishes higher polarization ratios in electroluminescence from nonpolar LEDs by performing an off-axis cut (or off-cut) of nonpolar-oriented wafers towards the polar (−c) orientation.

Technical Description

Polarized light emission from nonpolar and semipolar LEDs has been reported. The polarization ratio is a number to indicate degrees of polarization of light, 0 being no polarization for the light and 1 being fully polarized light. A typical value of a polarization ratio for these LEDs is 0.8. For practical applications of these polarized light sources, high polarization ratios are required.

There are several ways to increase polarization ratios of nonpolar LEDs. Induced strains by changing the LED structure and/or the substrate used will affect polarization ratios. Techniques may include the introduction of strain-controlling layers in the LED structure, or the use of foreign substrates. Carefully prepared LED chips can reduce stray light and increase polarization ratios. Operating LEDs at low temperature (~100 K) is another way to increased polarization ratio; however, this is not practical for light source applications. External techniques, for example, the use of a polarizer, are known, but are not preferred in terms of energy efficiency.

The technique described in the present invention is one way to improve polarization ratios. The inventors have experimentally confirmed that polarization ratios improved by employing off-cut substrates for LED structure growths.

Figure 3:
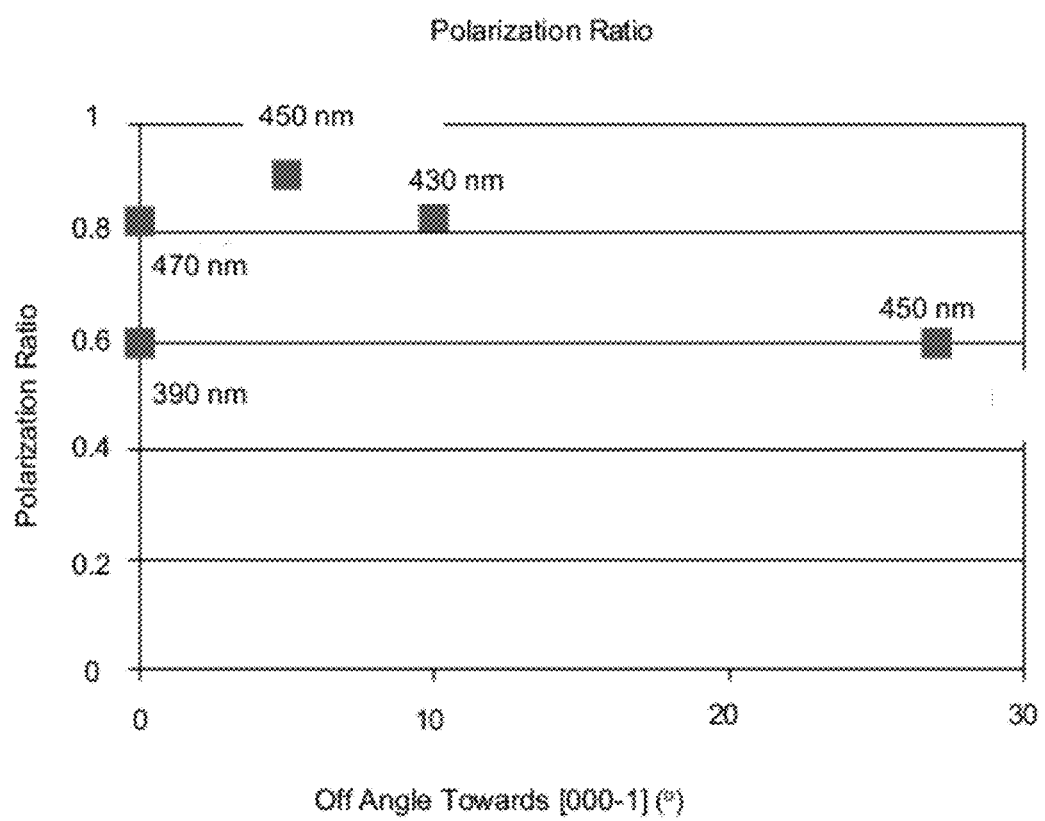
FIG. 3 is a graph that illustrates the polarization ratio of light emitted by LEDs as a function of the angle of off-axis cut with respect to the m-plane (of the LEDs' GaN substrate) and towards [000-1] (degrees, °), wherein an angle of 27° corresponds to a semipolar plane (10-1-1), the numbers adjacent to the data point markers indicate emission wavelengths (in nanometers, nm) of sample LEDs, and LED material composition and structures for the data in FIG. 3 is described in Ref. [1].

FIG. 3 is a graph that illustrates the polarization ratio as a function of off-cut angle with respect to the m-plane (of the LEDs' GaN substrate) and towards [000-1], wherein the numbers adjacent the data point markers indicate emission wavelengths of the sample LEDs.

As shown in FIG. 3, the polarization ratio tended to maximize at 5° of off-cut for 450 nm, while 10° of off-cut at 430 nm still maintained the same polarization ratio as that of 0° of off-cut at 470 nm, even though the emission wavelength was shorter (longer wavelengths tend to show higher polarization ratios due to higher strain induced by Indium (In) incorporation). Note also that 27° of off-cut, which corresponds to semipolar plane (10-1-1), at 450 nm has the same polarization ratio as that of 0° of off-cut at 390 nm.

These results have not been predicted by theoretical studies. The inventors attribute these phenomena to the strain state of light-emitting layers prepared on off-cut substrates.

Thus, one embodiment of the present invention employs m-plane GaN substrates (either sliced bulk substrates or hetero-epitaxially grown GaN layers on foreign substrates) with an off-cut angle between 0 and 27° towards [000-1]. By employing such substrates, resulting polarization ratio(s) of light emission(s) from LED structures fabricated on the substrates are higher than polarization ratio(s) of light emission(s) from LED structures fabricated on m-plane substrates without a (nominal) off-cut.

Process Steps

Figure 4:
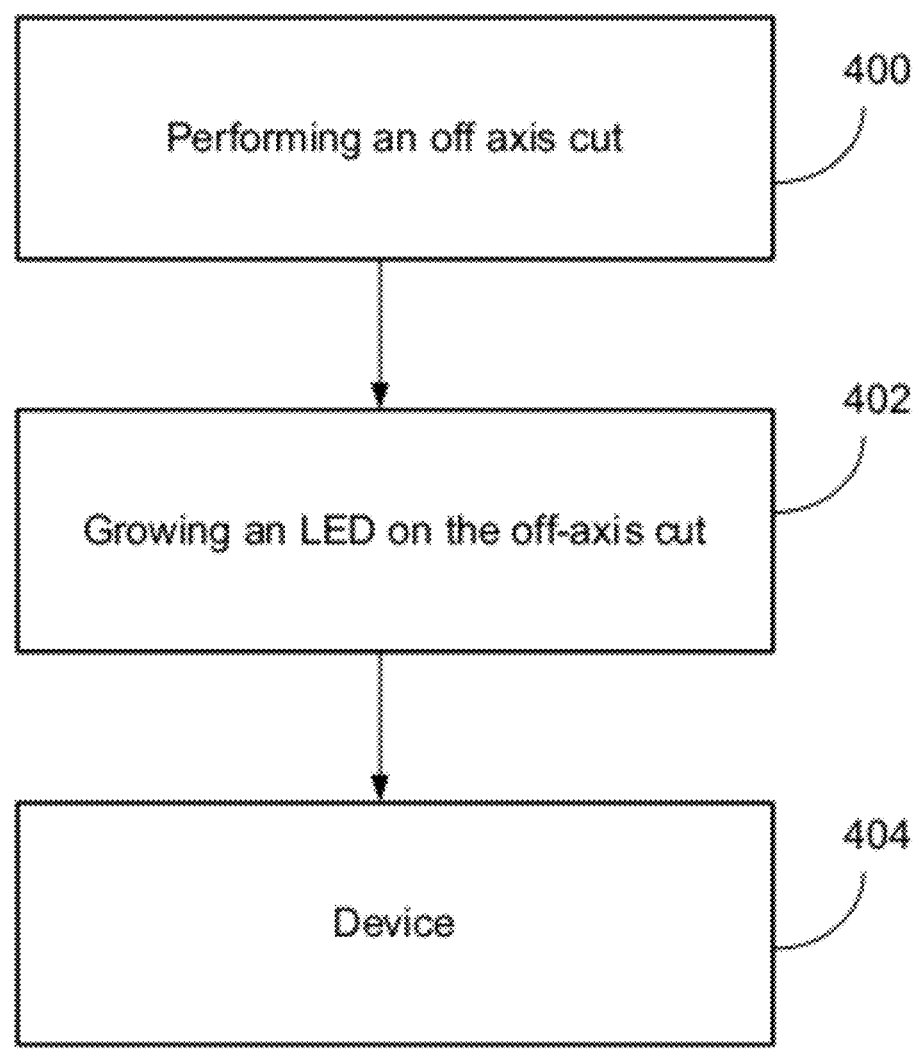
FIG. 4 is a flow chart illustrating a method of the present invention.

FIG. 4 is a flowchart illustrating a method for increasing a polarization ratio of light emission from a light-emitting diode (LED).

Block 400 represents the step of providing a surface of III-nitride angled with respect to a nonpolar plane, wherein the angle is towards a [0001] or [000-1] direction (or orientation). For example, the surface may be obtained by performing an off-axis cut of a nonpolar III-nitride towards a polar (−c or +c) orientation. However, other methods of obtaining the surface may be used.

The off-axis cut may have an off-axis cut angle between 0° and 27° and the orientation may be [000-1]. The off-axis cut angle may be about 5° to provide a higher polarization ratio than other off-axis cut angles between 0° and 27°.

Block 402 represents the step of growing the LED on the surface, for example, on the off-axis cut nonpolar III-nitride.

Block 404 represents a device fabricated using the method, for example a nonpolar LED. The light emission from the LED has a higher polarization ratio than without the off-axis cut. For example, for some structures provided as an example, FIG. 3 illustrates that a polarization ratio for an off-axis cut angle of 5° at the light emission's wavelength of 450 nm is about 0.91, the polarization ratio for an off-axis cut angle of 10° at the light emission's wavelength of 430 nm exceeds 0.80, the polarization ratio for an off-axis cut angle of 0° at the light emission's wavelength of 470 nm exceeds 0.80, the polarization ratio for an off-axis cut angle of 27° at the light emission's wavelength of 450 nm is about 0.55, and the polarization ratio for an off-axis cut angle of 0° at the light emission's wavelength of 390 nm is about 0.55.

Figure 5A:
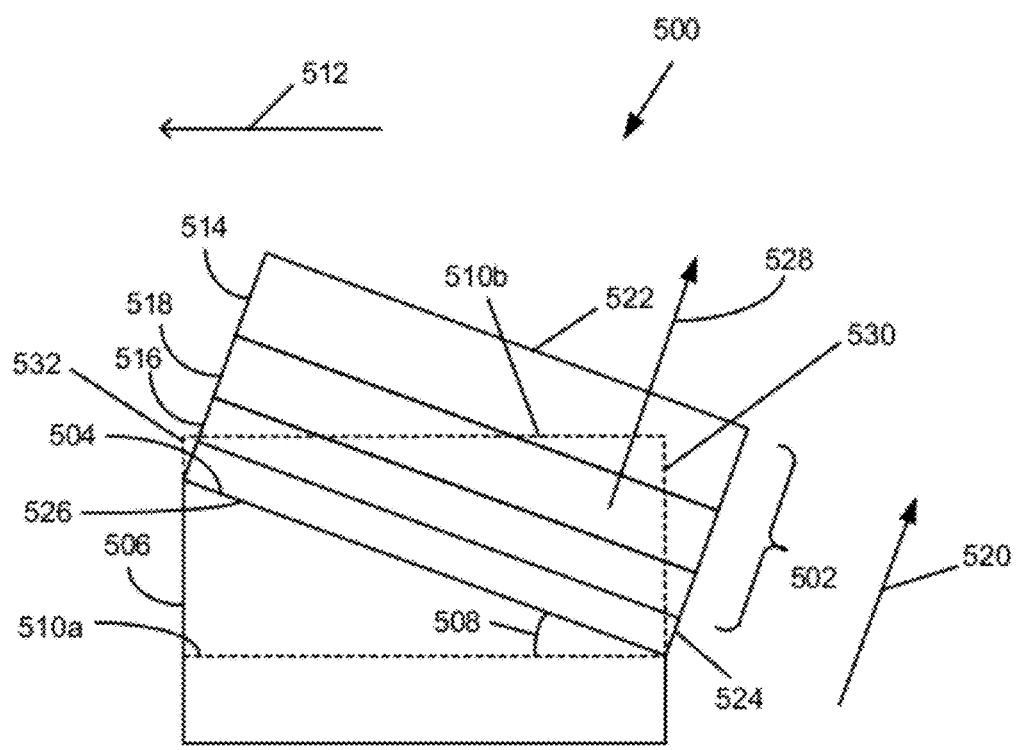
FIG. 5(a) is a cross-sectional schematic of a device fabricated according to the present invention.

FIG. 5(a) shows the device may be an LED 500, comprising one or more light-emitting layers 502 on a surface 504 of a nonpolar (e.g. a-plane or m-plane) oriented III-nitride substrate 506, wherein the surface 504 is at an off axis angle 508 with respect to the nonpolar plane 510a, 510b (e.g. a-plane or m-plane) of the nonpolar oriented III-nitride 506 and towards a [0001] or [000-1] direction or orientation 512 of the III-nitride 506, and the angle 508 achieves a polarization ratio, for light emitted by the light-emitting layers 502, in excess of 0.8. The light-emitting layers 502 may comprise a p-type III-nitride region 514 and an n-type III-nitride region 516 forming a p-n junction, or a light-emitting III-nitride active layer 518 (e.g. light-emitting QW), or the active layer 518 between the p-type layer 514 and n-type layer 516. As such, the light emitting layers 502 are oriented, or are grown in a direction 520, or have a top surface 522 which is at the angle 508 with respect to the plane 510a, 510b. Also shown are intermediate layers, e.g. III-nitride substrate layers 524.

The region or layers 502, 524 grown on the surface 504 may be Group III-nitride layers ((Al,B,Ga,In)N layers), as is known in the art for fabrication of (Al,B,Ga,In)N devices.

Typically, in actual devices, the on-axis nonpolar oriented III-nitride substrate 506 is removed after growth of layers 502, 524, so that the off-cut substrate 524 and off-cut device layers 502 have exposed parallel surfaces 522, 526 and the angle 508 cannot be seen unless a crystallographic method of determination is performed.

Also shown is an example of a surface 522 of the device 500 which transmits light 528 emitted by the active region 518. In FIG. 5(a), dotted line 510a and 510b indicate a nonpolar plane. In addition, dotted line 510b, together with and dotted lines 530 and 532, indicate regions where the nonpolar oriented III-nitride 506 may be removed to obtain the surface 504.

Figure 5B:
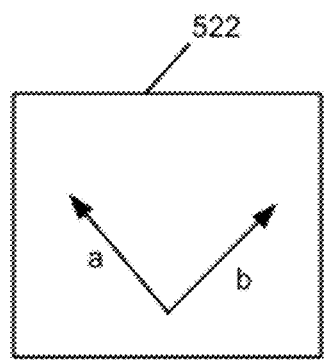
FIG. 5(b) is a schematic of a top view of the device in FIG. 5(a) and illustrating polarization directions a and b, wherein a and b are orthogonal and in the plane of the device surface.

FIG. 5(b) is a schematic top view (along normal of surface 522) of FIG. 5(a), illustrating polarization ratio of light 528. The polarization ratio of light ($\rho$) is commonly defined as $\rho=(I_a+I_b)/(I_a-I_b)$, where $I_a$ and $I_b$ are the intensities of the light 528 having polarization (electric fields) parallel to the in-plane directions (i.e., parallel to, or in the plane of, the device surface 522) a and b respectively, where the a and b directions are orthogonal to each other. In other words, $I_a$ is the intensity of the light 528 having polarization in the direction a, and $I_b$ is the intensity of the light 528 having polarization in the direction b. When p is zero, that is $I_a=I_b$, light 528 is un-polarized. When $I_a$ is not equal to $I_b$, light 528 is (partially) linearly polarized. When $I_a$ or $I_b$ is zero (that is, p is unity), light 528 is (perfectly) linearly polarized.

For ease of discussion (so that a and b are parallel to the surface 528), FIG. 5(a) only shows light 528 emerging perpendicular to surface 522; however light emerging at other angles and from other surfaces is possible. Thus, while the present invention's measurements of polarization ratio were performed by observing the light 528 emitted perpendicular to the surface 522, the polarizations a and b are typically determined with respect to the direction of observation (i.e., direction of light 528 propagation). Thus, a and b are not necessarily parallel to the surface 522 if light 528 does not propagate perpendicular to the surface 522. In reality, light 528 propagates at any direction from the surface 522, and the polarizations a and b are with respect to the direction of the observation (placement of the eye).

Possible Modifications and Variations

A possible modification of this invention is the employment of an off-cut towards [0001]. Crystallographic orientations of [000-1] and [0001] have similar characteristics. Consequently, wafer off-cuts towards [0001] may show the same advantages in optical polarization.

Another possible modification is to employ other nonpolar substrates, for example, the a-plane. Substrates prepared in the a-plane orientation can be off-cut either towards [000-1] or [0001].

Substrates 506 described in the present invention are not limited to sliced bulk GaN crystals (e.g. prior to the step represented by Block 400 or prior to preparing surface 504, a III-nitride substrate may be sliced along the nonpolar plane 510a, 510b to provide the nonpolar oriented III-nitride substrate 506), but include those GaN substrates 506 prepared on foreign substrates by epitaxial technology (e.g. growth along an a-axis or m-axis on the foreign substrate). However, substrates 506 can be prepared by any suitable method.

Semipolar LEDs or lasers could also be fabricated using the method of the present invention. Off-cut nonpolar orientations can also be considered as semipolar planes, depending on how large the off-cuts are. For example, 27° of off-cut from an m-plane towards the −c direction corresponds to the (10-1-1) semipolar orientation.

Advantages and Improvements

The present invention only employs off-cut substrates in device structure growths to replace conventional substrates without a nominal off-cut. Hence, no further processes in material growths, clean-room processing, nor device packaging are required. Wafer off-cuts are often used in device growths, yet no effects of off-cuts on optical polarization characteristics were known. Also, large off-cut angles (such as 5° and 10°) are not commonly used, because such off-cuts are generally believed to significantly alter growth.

One particular application of this invention is for the backlighting of LCDs. LCDs are a growing technology in flat panel displays. Because they are not self-emitting devices, LCDs require a light source in the display unit. The light source is now changing from cold cathode fluorescent tubes to LEDs, so it is expected that this segment of LED market will increase.

LCDs 600 are based on light polarization technology, as shown in FIG. 6(a) and FIG. 6(b). A thin layer of liquid crystal 602 works as an electrically controlled polarization rotator. When linearly polarized light 604 is incident on a liquid crystal layer 602, the light 604 can be passed though (light output 606, FIG. 6(a)) or blocked (no light output 606, FIG. 6(b)) by electrically operating 608 the liquid crystal 602. What an LCD unit 600 requires is a light source 610 combined with a linear polarizer 612 which is a plastic sheet to filter out unfavorably polarized components of the source light 614 emitted by the light source 610. For example, FIG. 6(b) shows then when an alternating current (AC) voltage 608 is applied to the liquid crystal 602, the liquid crystal 602 does not rotate the polarization of light 604 so that the light output 616 is blocked by polarizer 618. FIG. 6(a) shows that in the absence of an applied AC voltage 608, the liquid crystal 602 rotates the polarization of light 604 to form light 620 that has a polarization that passes through polarizer 618 to form light output 606. Also shown in FIG. 6(a) and FIG. 6(b) is an alignment film 622.

The polarizer 612 transmission is typically 80%, therefore 20% of the light 614 is lost due to the polarizer 612. If one or more polarized LEDs (as the light source 610) are applied to LCDs, the polarizer 612 is no longer required, and display brightness is greatly increased. In addition, the weight of the display unit 600 is decreased. To attain these advantages, high polarization ratios are required for the LED 610. The present invention is a simple technique to contribute towards this aim.

REFERENCES

The following references are incorporated by reference herein:

1. Hisashi Yamada, Kenji Iso, Makoto Saito, Kenji Fujito, Steven P. DenBaars, and Shuji Nakamura, "Impact of Substrate Miscut on the Characteristic of m-plane InGaN/GaN Light Emitting Diodes," Jpn. J. Appl. Phys. Vol. 46, No. 46, p. L1117 (2007).

2. K. Okamoto, et al., "Dislocation-free m-plane InGaN/GaN light-emitting diodes on m-plane GaN single crystals," Jpn. J. Appl. Phys. 45, L1197 (2006). This paper reports a polarization ratio of 0.77 on nonpolar LEDs fabricated on a bulk-GaN substrate.

3. H. Tsujimura, et al., "Characteristics of polarized electroluminescence from m-plane InGaN-based light emitting diodes," Jpn. J. Appl. Phys. 46, L1010 (2007). This paper reports maximum polarization ratios of 0.8 on nonpolar LEDs fabricated on a bulk-GaN substrate.

4. S. Nakagawa, "Temperature dependence of polarized electroluminescence from nonpolar m-plane InGaN-based light emitting diodes," Appl. Phys. Lett. 91, 171110 (2007). This paper reports on temperature effects on polarization ratios. The highest number reported is 0.98 (measured at 100 K). 0.85 is reported as a polarization ratio at room temperature.

5. A. A. Yamaguchi, "Anisotropic optical matrix elements in strained GaN quantum wells," Jpn. J. Appl. Phys. 46, L789 (2007). This paper presents theoretical calculations of polarization on nonpolar and other inclined planes.

6. Hisashi Masui, Hisashi Yamada, Kenji Iso, Shuji Nakamura, and Steven P. DenBaars, entitled "Optical polarization characteristics of m-oriented InGaN/GaN light-emitting diodes with various indium compositions in single-quantum-well structure," J. Phys. D: Appl. Phys. 41 (2008) 225104 (7 pp).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a light-emitting diode (LED), comprising:
growing an LED structure on or above a surface of a nonpolar III-nitride substrate, wherein:
the surface is at an angle with respect to a nonpolar plane of the nonpolar III-nitride substrate,
the angle is towards a polar (−c or +c) orientation, and
the surface obtains a pre-determined polarization ratio of light emitted by the LED structure.

2. The method of claim 1, wherein the angle is such that light emission from the LED has a higher polarization ratio than an LED grown on the nonpolar plane of the nonpolar III-nitride substrate.

3. The method of claim 1, wherein the angle is between 0° and 27° and towards the [000-1] orientation.

4. The method of claim 1, wherein the angle is about 5°.

5. The method of claim 1, wherein the angle and the LED structure obtain a polarization ratio of at least 0.91 for light emitted by the LED structure having a wavelength of 450 nm.

6. The method of claim 1, wherein the angle and the LED structure obtain a polarization ratio that exceeds 0.8 for light emitted by the LED structure having a wavelength of 430 nm.

7. The method of claim 1, wherein the angle and the LED structure obtain a polarization ratio that exceeds 0.8 for light emitted by the LED structure having a wavelength of 470 nm.

8. The method of claim 1, wherein the angle and the LED structure obtain a polarization ratio of at least about 0.55 for light emitted by the LED structure having a wavelength of 450 nm.

9. The method of claim 1, wherein the angle and the LED structure obtain a polarization ratio of at least about 0.55 for light emitted by the LED having a wavelength of 390 nm.

10. The method of claim 1, wherein the LED structure is a nonpolar LED structure.

11. A light-emitting diode (LED) fabricated according to the method of claim 1.

12. The method of claim 1, further comprising selecting the angle to control a polarization ratio of light emitted by the LED structure.

13. The method of claim 1, wherein the surface obtains a polarization ratio in excess of 0.9 for one or more selected wavelengths of light emitted by the LED structure.

14. The method of claim 1, wherein the surface maximizes a polarization ratio of light emitted by the LED structure.

15. The method of claim 1, further comprising selecting the surface to obtain the pre-determined polarization ratio of light emitted by the LED structure.

16. The method of claim 1, further comprising selecting the surface depending on a wavelength and polarization ratio of light emitted by the LED.

17. The method of claim 1, wherein the surface obtains the LED structure emitting polarized light for back lighting a liquid crystal display.

18. The method of claim 1, wherein the LED is a backlight for a liquid crystal display, wherein the liquid crystal display does not comprise a polarizer.

19. The method of claim 1, wherein the III-nitride substrate is a Gallium Nitride substrate.

20. The method of claim 19, wherein the non-polar surface orientation of the Gallium Nitride substrate is m-plane.

21. The method of claim 1, wherein the surface is an off-axis cut or miscut of the III-nitride substrate.

22. The method of claim 1, wherein the surface is a semipolar plane and the LED structure is a semipolar LED structure.

23. The method of claim 1, further comprising providing or obtaining the surface of the III-nitride substrate, or miscutting the III-nitride substrate to form the surface.

24. A method of fabricating a light-emitting diode (LED), comprising:
providing or obtaining a surface of a III-nitride substrate, or miscutting the III-nitride substrate to form the surface, wherein:
the surface is at an angle with respect to a nonpolar plane of the III-nitride substrate, and
the angle is towards a polar (−c or +c) orientation, and
growing an LED structure on or above the surface of a III-nitride substrate, wherein the angle is selected to control a polarization ratio of light emitted by the LED structure.

25. The method of claim 24, wherein the surface obtains the LED structure emitting polarized light for back lighting a liquid crystal display.

26. The method of claim 24, wherein the surface obtains a polarization ratio in excess of 0.9 for one or more selected wavelengths of light emitted by the LED structure.

* * * * *